US012812904B2

(12) United States Patent
Chung et al.

(10) Patent No.: US 12,812,904 B2
(45) Date of Patent: Nov. 24, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Cheng-Ting Chung, Hsinchu City (TW); Yu-Xuan Huang, Hsinchu (TW); Hou-Yu Chen, Hsinchu County (TW); Jin Cai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 644 days.

(21) Appl. No.: 17/841,685

(22) Filed: Jun. 16, 2022

(65) Prior Publication Data

US 2023/0411467 A1 Dec. 21, 2023

(51) Int. Cl.
*H10D 30/67* (2025.01)
*B82Y 10/00* (2011.01)
(Continued)

(52) U.S. Cl.
CPC ....... *H10D 30/6729* (2025.01); *H10D 30/014* (2025.01); *H10D 30/025* (2025.01);
(Continued)

(58) Field of Classification Search
CPC .. H10D 64/62; H10D 30/6729; H10D 30/014; H10D 30/031; H10D 30/6728; H10D 30/0318; H10D 30/689; H10D 30/6713; H10D 30/6735; H10D 30/6757; H10D 84/0186; H10D 84/0195; H10D 84/903; H10D 84/017; H10D 84/038; H10D 84/85; H10D 30/43–435; H10D 30/025; H10D 30/63; H10D 30/673; H10D 30/6736; H10D 62/118–122; H10D 62/822; H10D 64/252; H10D 64/518; H10D 84/016; H10D 84/83; H10D 84/0149; H10D 84/0167; H10H 20/8314; H10H 20/826;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Sue A Purvis
*Assistant Examiner* — Aneta B Cieslewicz
(74) *Attorney, Agent, or Firm* — JCIPRNET

(57) ABSTRACT

A semiconductor device includes a channel region, first and second S/D contacts, first and second S/D epitaxial regions, a gate structure, and a gate contact. The channel region includes a first surface, a second surface opposite to the first surface, and a sidewall connected to the first surface and the second surface. The first S/D contact is disposed over the first surface of the channel region, the second S/D contact is disposed underneath the second surface of the channel region, the first S/D epitaxial region underlies the first S/D contact and overlies the first surface of the channel region, and the second S/D epitaxial region overlies the second S/D contact and underlies the second surface of the channel region. The gate structure surrounds the sidewall of the channel region, and the gate contact is disposed in proximity to the second S/D contact and lands on the gate structure.

20 Claims, 14 Drawing Sheets

(51) Int. Cl.

| | |
|---|---|
| ***H10D 30/01*** | (2025.01) |
| ***H10D 30/43*** | (2025.01) |
| ***H10D 30/63*** | (2025.01) |
| ***H10D 62/10*** | (2025.01) |
| ***H10D 62/822*** | (2025.01) |
| ***H10D 64/23*** | (2025.01) |
| ***H10D 64/27*** | (2025.01) |
| ***H10D 64/62*** | (2025.01) |
| ***H10D 84/01*** | (2026.01) |
| ***H10D 84/03*** | (2025.01) |
| ***H10D 84/83*** | (2025.01) |
| ***H10D 84/85*** | (2025.01) |
| ***H10P 14/20*** | (2026.01) |
| ***H10P 95/00*** | (2026.01) |
| ***H10W 72/20*** | (2026.01) |

(52) U.S. Cl.

CPC ........... *H10D 30/031* (2025.01); *H10D 30/43* (2025.01); *H10D 30/63* (2025.01); *H10D 30/6713* (2025.01); *H10D 30/6728* (2025.01); *H10D 30/6735* (2025.01); *H10D 30/6757* (2025.01); *H10D 62/122* (2025.01); *H10D 64/252* (2025.01); *H10D 64/518* (2025.01); *H10D 64/62* (2025.01); *H10D 84/0149* (2025.01); *H10D 84/016* (2025.01); *H10D 84/0167* (2025.01); *H10D 84/017* (2025.01); *H10D 84/0186* (2025.01); *H10D 84/0195* (2025.01); *H10D 84/038* (2025.01); *H10D 84/83* (2025.01); *H10D 84/85* (2025.01); *H10P 14/3462* (2026.01); *H10P 95/11* (2026.01); *B82Y 10/00* (2013.01); *H10D 62/822* (2025.01); *H10W 72/244* (2026.01)

(58) Field of Classification Search

CPC ..... H01L 21/02603; H01L 2924/13091; H01L 21/7806; H01L 24/13; H01L 2224/13026

See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 8,963,258 | B2 | 2/2015 | Yu et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,209,247 | B2 | 12/2015 | Colinge et al. |
| 9,214,555 | B2 | 12/2015 | Oxland et al. |
| 9,236,267 | B2 | 1/2016 | De et al. |
| 9,236,300 | B2 | 1/2016 | Liaw |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,548,303 | B2 | 1/2017 | Lee et al. |
| 9,576,814 | B2 | 2/2017 | Wu et al. |
| 9,608,116 | B2 | 3/2017 | Ching et al. |
| 10,121,877 | B1 * | 11/2018 | Hook ................ H01L 29/78618 |
| 2011/0303973 | A1 * | 12/2011 | Masuoka ........... H10D 30/6713 257/329 |
| 2017/0309631 | A1 * | 10/2017 | Cheng .................. H10D 84/038 |
| 2019/0304974 | A1 * | 10/2019 | Sharma .............. H10D 30/6728 |
| 2019/0319099 | A1 * | 10/2019 | Cheng .................... H10D 30/63 |
| 2019/0348540 | A1 * | 11/2019 | Pillarisetty ...... H01L 21/823412 |
| 2020/0373413 | A1 * | 11/2020 | Song ...................... H10D 30/63 |
| 2021/0202385 | A1 * | 7/2021 | Huang ................... H10D 30/62 |
| 2021/0265358 | A1 * | 8/2021 | Tsai ....................... H10B 12/33 |

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. In order to form an IC device in a small area, vertical gate-all-around (VGAA) transistors are developed. A VGAA transistor enables enhanced control of the charge carriers along the lengthwise direction through a complete encirclement of the channel region of a semiconductor nanowire by gate dielectric and gate electrode layers. The VGAA transistor has a reduced short channel effect because the channel region is surrounded by the gate electrode layer, so that an effect of the source/drain region on an electric field of the channel region can be reduced. Although existing VGAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-11, 12A, 13-16A, and 17 are schematic cross-sectional views illustrating various stages of a manufacturing method of a semiconductor device, in accordance with some embodiments.

DETAILED DESCRIPTION

Figure 2:
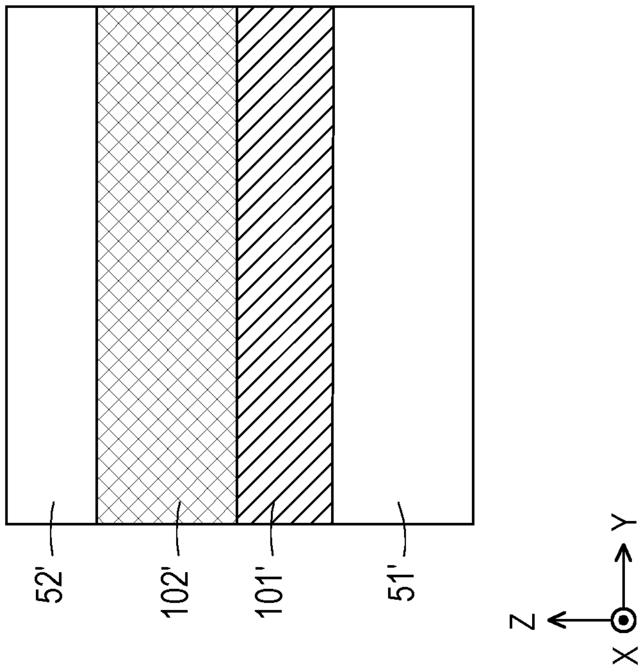

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 11:
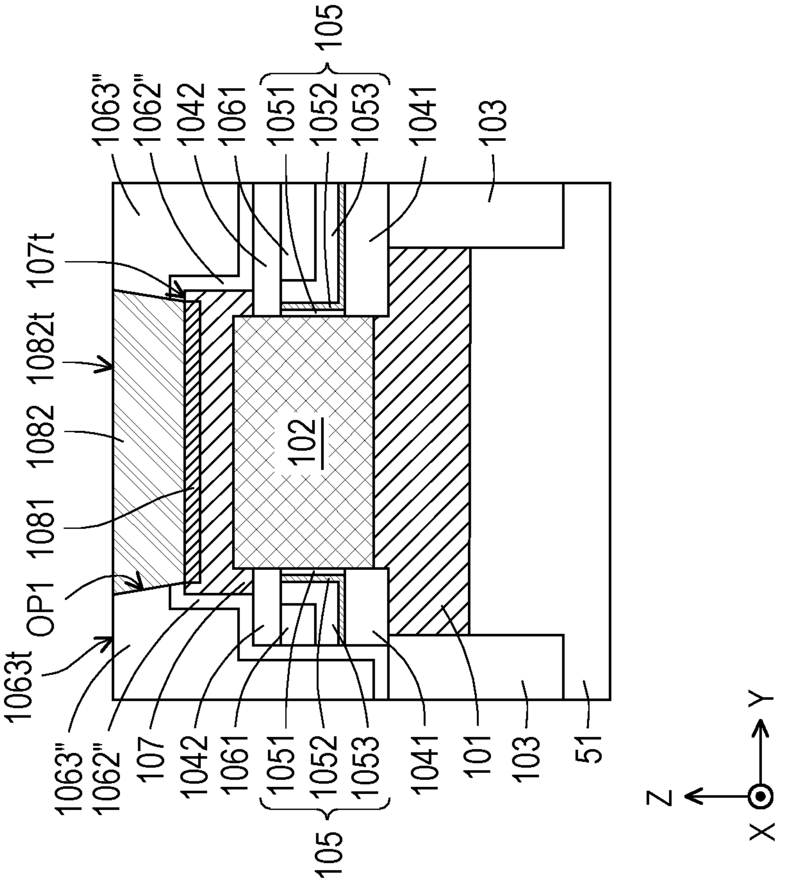
Figure 12B:
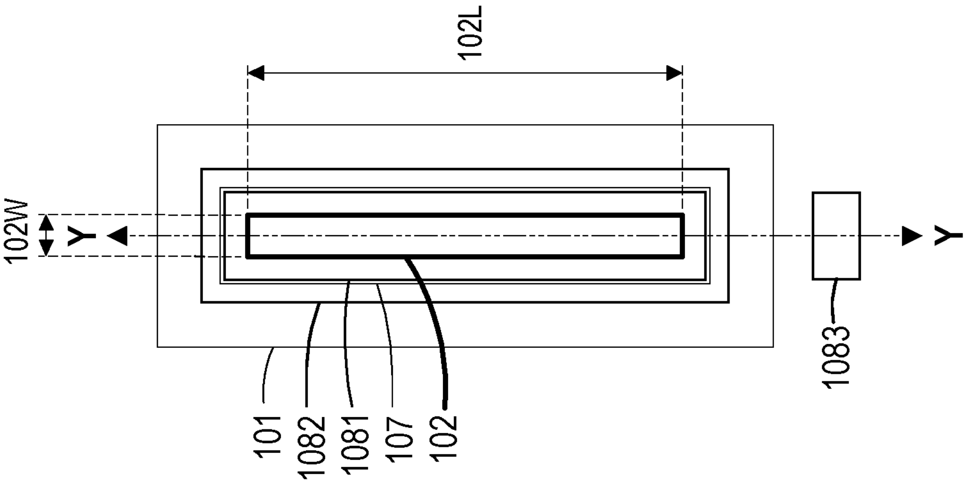
FIGS. 12B and 16C are schematic and simplified top views illustrating the structures of FIGS. 12A and 16A, respectively, in accordance with some embodiments.
Figure 12A:
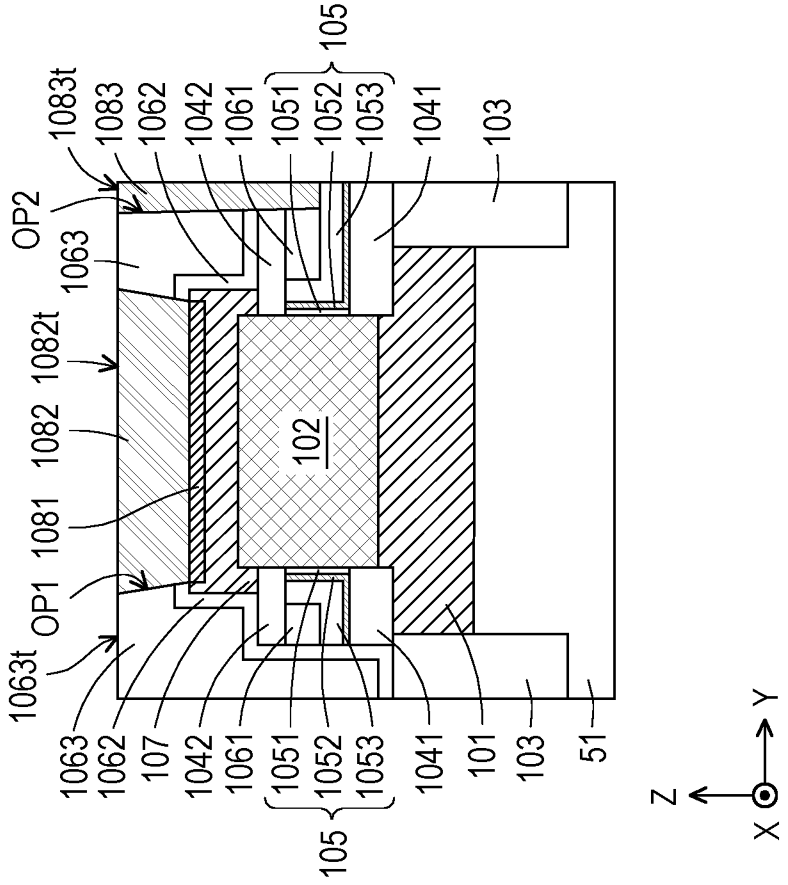
Figure 15:
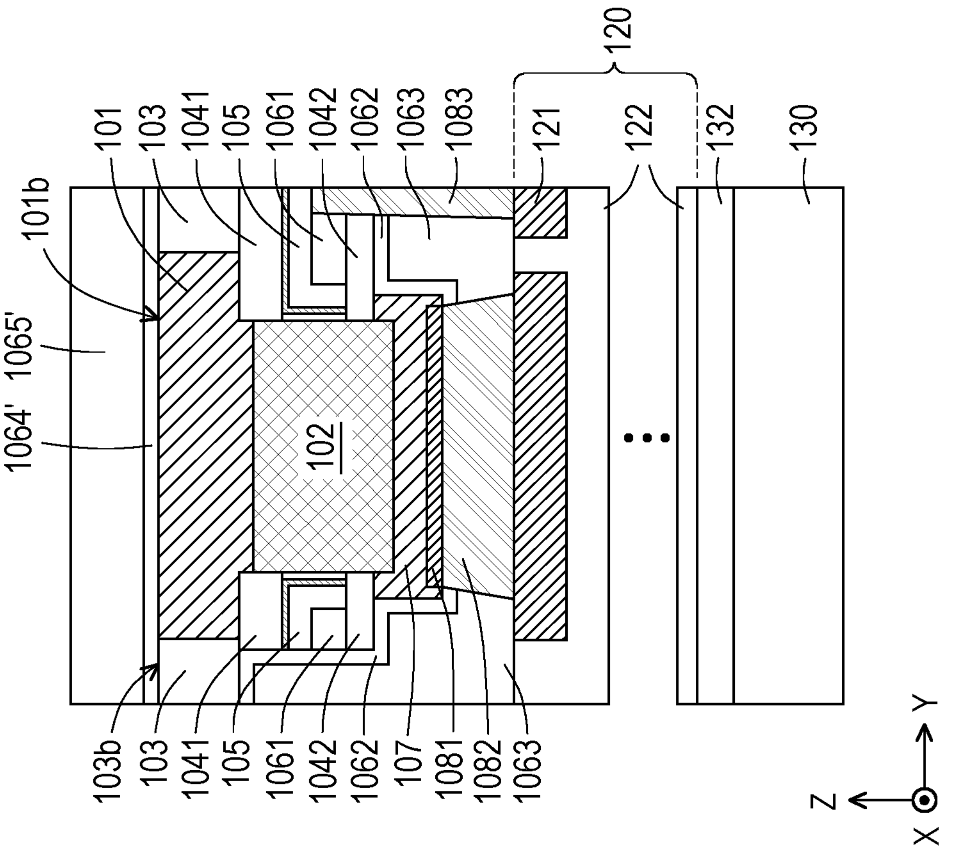
Figure 16B:
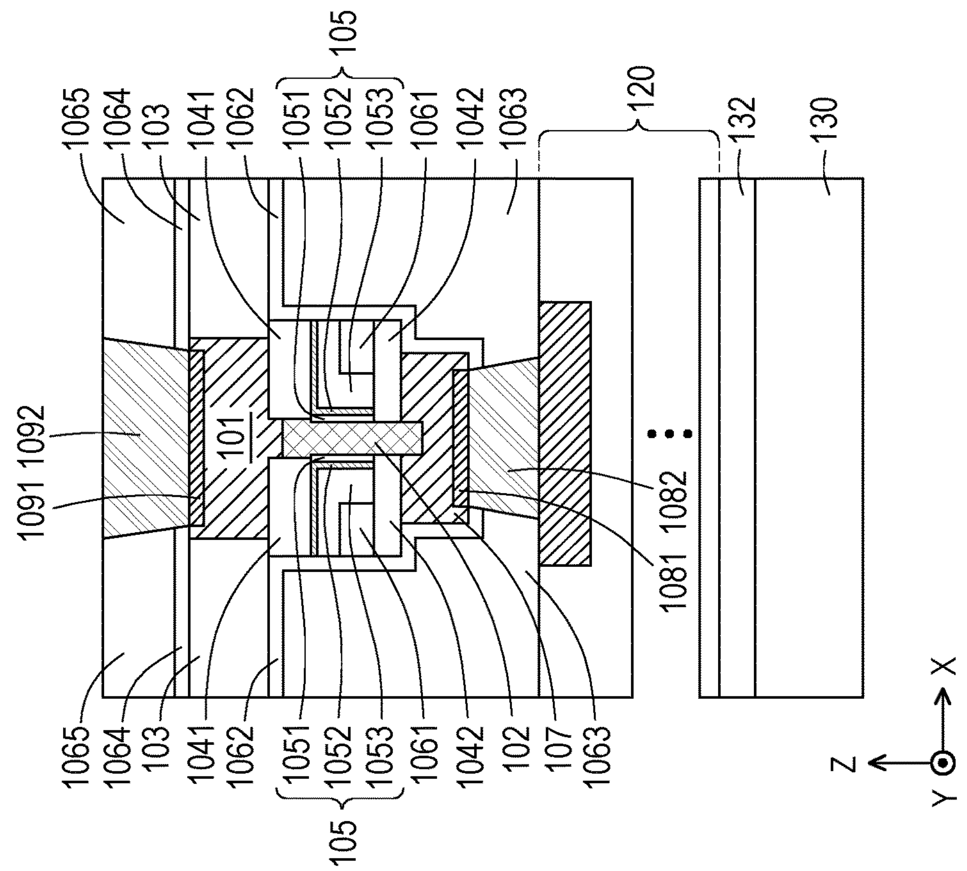
FIG. 16B is another schematic cross-sectional view showing the structure of FIG. 16A, in accordance with some embodiments.
Figure 16A:
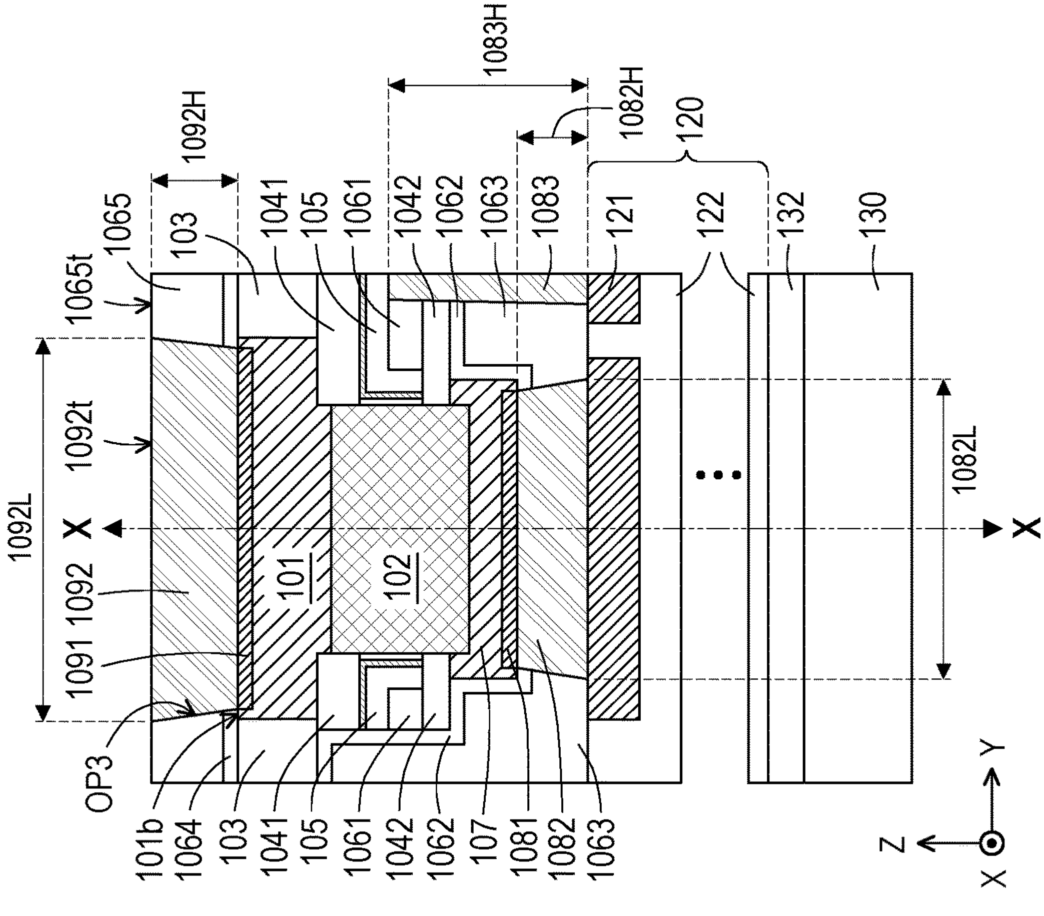
Figure 16C:
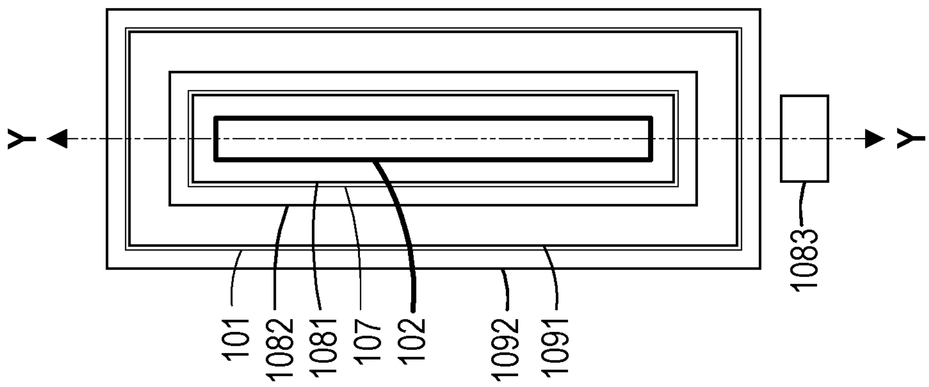

FIGS. 1-11, 12A, 13-16A, and 17 are schematic cross-sectional views illustrating various stages of a manufacturing method of a semiconductor device, FIGS. 12B and 16C are schematic and simplified top views illustrating the structures of FIGS. 12A and 16A, respectively, and FIG. 16B is another schematic cross-sectional view showing the structure in FIG. 16A, in accordance with some embodiments. Note that FIGS. 1-11, 12A, 13-16A, and 17 illustrate cross-sectional views taken along the Y-direction which corresponds to a cross-section cut along the longitudinal direction of a gate structure, and FIG. 16B illustrates a cross-sectional view taken along the X-direction which is substantially perpendicular to the Y-direction. For clarity of illustrations, in the drawings are illustrated the orthogonal axes (X, Y and Z) of the Cartesian coordinate system according to which the views are oriented. It is understood that additional operations can be provided before, during, and after the operations shown by FIGS. 1-11, 12A, 13-16A, and 17, and some of the operations described below can be replaced or eliminated, for additional embodiments of the method. The order of the operations/processes may be interchangeable.

Figure 1:
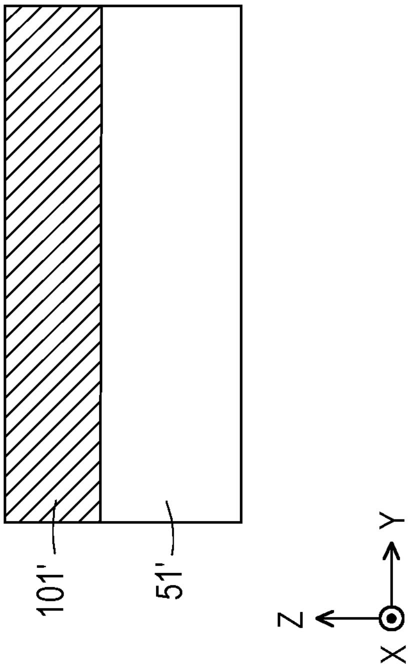

Referring to FIG. 1, a first source/drain (S/D) epitaxial structure 101' may be formed on a substrate 51'. The substrate 51' may be a semiconductor substrate (e.g., a bulk semiconductor), a semiconductor-on-insulator (SOI) substrate, a multi-layered substrate, a gradient substrate, or the like. In some embodiments, the material of the substrate may include semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GalnAs, GaInP, and/or GaInAsP; or combinations thereof. The substrate 51' may be considered as a sacrificial layer since it will be removed during the subsequent processes.

The first S/D epitaxial structure 101' may be formed on the substrate 51' by using an epitaxy process, such as molecular beam epitaxy (MBE), liquid phase epitaxy (LPE), vapor phase epitaxy (VPE), selective epitaxial growth (SEG), other deposition process such as metal-organic (MO) chemical vapor deposition (CVD), combinations thereof, etc. The first S/D epitaxial structure 101' formed in n-type field-effect transistor (FET) region and p-type FET region (not individually labeled) may include different epitaxy materials, different dopants, and/or different doping concentrations depending on the device design. Suitable materials for the first S/D epitaxial structure 101' in n-type FET region may include n-type epitaxy materials such as SiP, SiAs, SiCP, III-V material (e.g., InP, GaAs, AlAs, InAs, InAlAs, InGaAs, and the like), combinations thereof, etc. Suitable epitaxy materials for the first S/D epitaxial structure 101' in p-type FET region may include p-type epitaxy materials such as Si:B, SiGe:B, III-V material (e.g., InSb, GaSb, InGaSb, and the like), combinations thereof, etc.

Referring to FIG. 2, a channel structure 102' may be formed on the first S/D epitaxial structure 101', and then a hard mask layer 52' may be formed on the channel structure 102'. The channel structure 102' may be formed by using an epitaxy process, a deposition process, combinations thereof, or any suitable process. The material of the channel structure 102' may depend on the desired type in the respective region. Suitable materials for the channel structure 102' may include Si, SiGe, Ge, III-V material, combinations thereof, etc. The channel structure 102' may include a different material, different dopants, and/or a different doping concentration depending on the device design. The hard mask layer 52' may include one or more layers to prevent damage to the underlying epitaxial structure during patterning (e.g., etching). Suitable materials for the hard mask layer 52' may include oxide (e.g., $SiO_2$), nitride (e.g., SiN), SiON, SiCN, SiOCN, $HfO_2$, $ZrO_2$, combinations thereof, etc. The hard mask layer 52' may be formed by using any suitable deposition process, such as atomic layer deposition (ALD), CVD, high density plasma CVD (HDP-CVD), physical vapor deposition (PVD), and the like.

Figure 3:
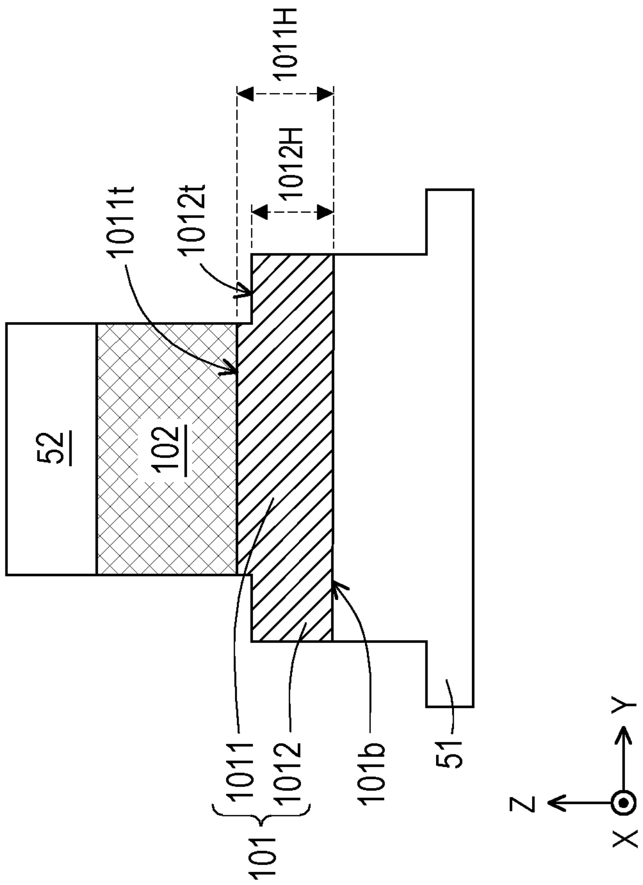

Referring to FIG. 3 and with reference to FIG. 2, one or more patterning process may be performed on the hard mask layer 52', the channel structure 102', the first S/D epitaxial structure 101', and the substrate 51'. For example, a first patterning process is performed to remove a portion of the first S/D epitaxial structure 101' and the underlying portion of the substrate 51' so as to form a first S/D epitaxial region 101 and a patterned substrate 51 by using a combination of lithography and etching or any suitable patterning technique. The lithography process may include photoresist coating, soft baking, mask aligning, exposure, post-exposure baking, developing the photoresist, rinsing, hard baking, other suitable processes, or combinations thereof, so as to form a patterned photoresist (not illustrated) over the hard mask layer 52'. After the lithography process, the hard mask layer 52' may be patterned using the patterned photoresist mask as an etch mask. With the first pattern of the patterned hard mask layer is created, the structure underlying the patterned hard mask may be etched to define the first S/D epitaxial region 101 and the patterned substrate 51.

A second patterning process may then be performed to remove a portion of the hard mask layer 52' and the underlying portion of the channel structure 102' so as to form a channel region 102 and a patterned hard mask layer 52 by using a combination of lithography and etching or any suitable patterning technique. The lithography process may be similar to the lithography process described above, to form a patterned photoresist (not illustrated) over the hard mask layer 52'. After the lithography process, the hard mask layer 52' may be patterned using the patterned photoresist mask as an etch mask to form the patterned hard mask layer 52. With the second pattern of the patterned hard mask layer 52 is created, the channel structure 102' underlying the patterned hard mask layer 52 may be etched so as to define the channel region 102. When etching the channel structure 102', the underlying structure including the first S/D epitaxial region 101 and the patterned substrate 51 may be covered by a mask (not illustrated) for protection.

In some embodiments, a top portion of the first S/D epitaxial region exposed by the channel region 102 is slightly removed during the etching. For example, a first top surface 1011*t* of a first portion 1011 of the first S/D epitaxial region 101 directly underlying the channel region 102 is higher than a second top surface 1012*t* of a second portion 1012 of the first S/D epitaxial region 101 exposed by the channel region 102, relative to a bottom surface 101*b* of the first S/D epitaxial region 101 facing the patterned substrate 51. The first portion 1011 of the first S/D epitaxial region 101 directly underlying the channel region 102 may have a thickness 1011H greater than a thickness 1012H of the second portion 1012 of the first S/D epitaxial region 101 exposed by the channel region 102. Subsequently, any remaining portions of photoresist (not illustrated) may be removed by ashing, stripping, or any suitable processes.

Figure 4:
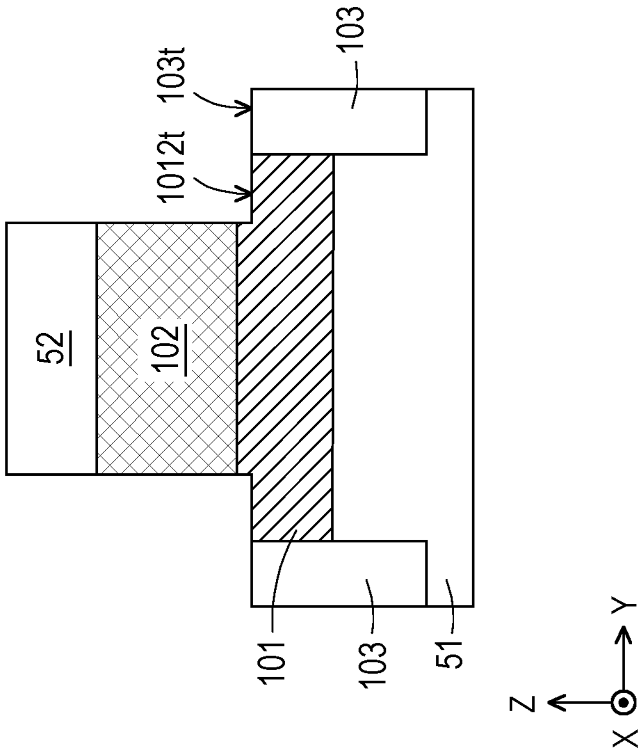

Referring to FIG. 4, isolation structures 103 (also called shallow trench isolation (STI) regions) may be formed on the patterned substrate 51 and extend along opposing sides of the first S/D epitaxial region 101. In some embodiments, the second top surface 1012*t* of the first S/D epitaxial region 101 and top surfaces 103*t* of the isolation structures 103 are substantially leveled, within process variations. The isolation structures 103 may be formed of an insulation material (e.g., an oxide, a Si-based oxide (e.g., SiOC, SiOCN, or the like), a nitride, the like, any other suitable material, or combinations thereof) which may electrically isolate neighboring first S/D epitaxial regions 101 from one another. Each isolation structure 103 may be used to separate various semiconductor devices in different regions. For example, the isolation structures 103 are used to isolate devices of a different type (n-type or p-type), of a same type, or the like.

Figure 5:
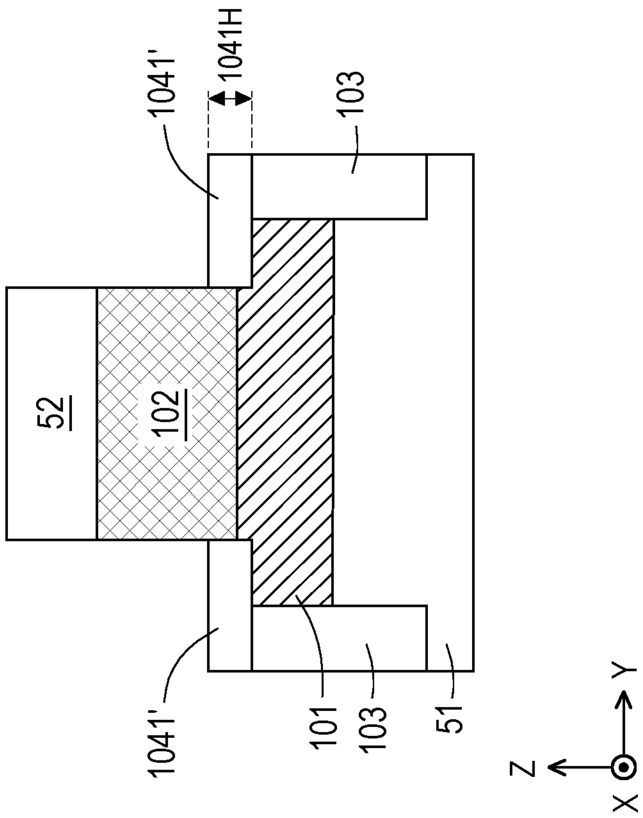

Referring to FIG. 5 and with reference to FIG. 4, a first spacer layer 1041' may be formed on the top surfaces 1012*t* and 103*t* of the first S/D epitaxial region 101 and the isolation structures 103 and may extend along opposing sides of the channel region 102. The first spacer layer 1041' may be formed by depositing a layer of spacer material on the first S/D epitaxial region 101 and the isolation structures 103 to bury the patterned hard mask layer 52 and the channel region 102, and etching back the layer of spacer material to a desired thickness. Suitable materials for the first spacer layer 1041' may include oxide (e.g., $SiO_2$), nitride (e.g., SiN), SiON, SiCN, SiOCN, SiOC, combinations thereof, etc. The thickness 1041H of the first spacer layer 1041' may be in a range of about 2 nm to about 15 nm. Although other value of thickness may be possible, depending on design requirements.

Figure 6:
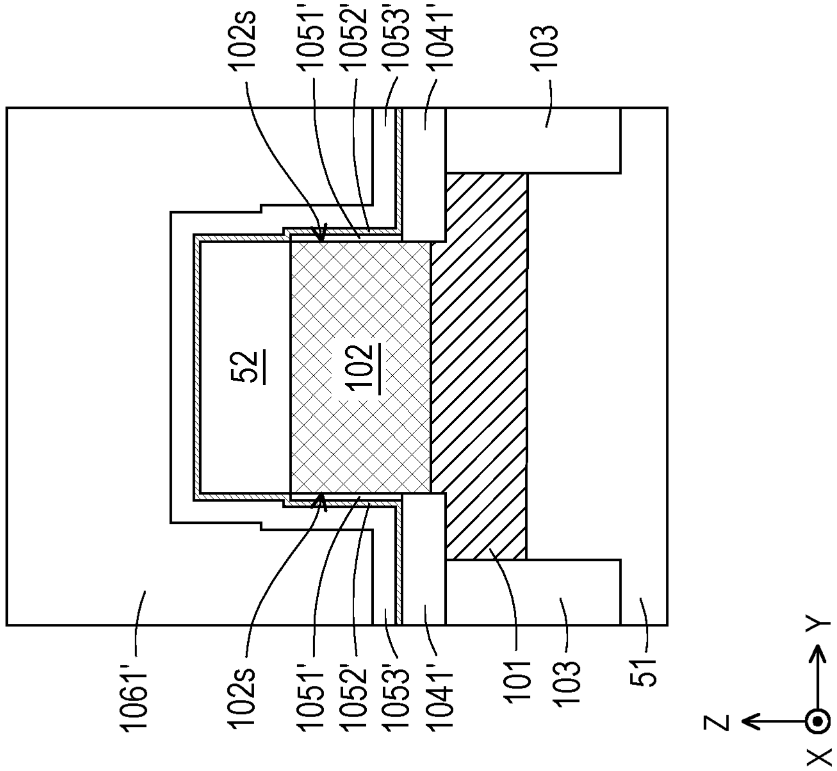

Referring to FIG. 6 and with reference to FIG. 5, an interfacial material layer 1051', a high-k dielectric material layer 1052', a gate metal material layer 1053', and a first dielectric material layer 1061' may be sequentially formed. For example, the interfacial material layer 1051' is formed on the opposing sidewalls 102*s* of the channel region 102 that are exposed by the first spacer layer 1041'. Suitable materials for the interfacial material layer 1051' may include an oxide-containing layer (e.g., $SiO_2$, HfSiO), a nitride layer (e.g., SiN), an oxynitride layer (e.g., SiON,), the like, any other suitable material, or combinations thereof. The interfacial material layer 1051' may be formed by a chemical oxide technique, thermal oxide technique, ALD, CVD, or other suitable technique. Next, the high-k dielectric material layer 1052' may be conformally formed to cover the top surface of the first spacer layer 1041', the sidewalls of the interfacial material layer 1051', and the top surface and the sidewalls of the patterned hard mask layer 52. Suitable materials for the high-k dielectric material layer 1052' may include metal oxides, metal nitrides, metal silicates, transition metal-oxides, transition metal-nitrides, transition metal-silicates, or oxynitrides of metals, for example, HfSiO, $HfO_2$, $ZrO_2$, etc. The high-k dielectric material layer 1052' may be formed by a suitable process, such as ALD, CVD, PVD, PECVD, MOCVD, other suitable processes, or combinations thereof.

Next, the gate metal material layer 1053' may be conformally formed on the high-k dielectric material layer 1052'. The gate metal layer 1082 may include a stack of multiple metal materials such as a liner material, a barrier material, a seed material, and a metallic material. Suitable materials for the gate metal material layer 1053' may include W, TiN, Ti, TaN, Ta, Al, combinations thereof, etc. Subsequently, the first dielectric material layer 1061' may be deposited on the gate metal material layer 1053'. Suitable materials for the first dielectric material layer 1061' may include $SiO_2$, SiN, SiON, SiCN, SiOCN, etc.

Figure 7:
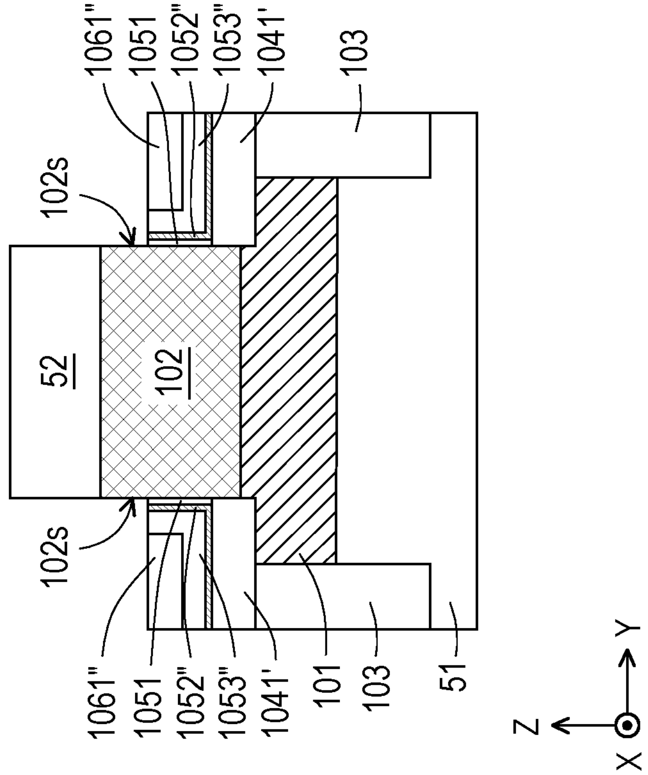

Referring to FIG. 7 and with reference to FIG. 6, portions of the interfacial material layer 1051', the high-k dielectric material layer 1052', the gate metal material layer 1053', and the first dielectric material layer 1061' that cover the patterned hard mask layer 52 and the sidewalls of the top portion of the channel region 102 may be removed. For example, one or more etching process may be performed to remove the portions of the interfacial material layer 1051', the high-k dielectric material layer 1052', the gate metal material layer 1053', and the first dielectric material layer 1061' so as to form an interfacial layer 1051, an etched high-k dielectric layer 1052", an etched gate metal material layer 1053", and an etched first dielectric layer 1061", respectively. In some embodiments, the anisotropic etch selectively removes the portions of the interfacial material layer 1051', the high-k dielectric material layer 1052', the gate metal material layer 1053', and the first dielectric material layer 1061' but does not substantially etch the channel region 102. For example, after the removal, the patterned hard mask layer 52 is fully exposed and the upper portion of the sidewalls 102*s* of the channel region 102 is also accessibly exposed. In some embodiments, after the removal, top surfaces of the interfacial layer 1051, the etched high-k dielectric layer 1052", the etched gate metal material layer 1053", and the etched first dielectric layer 1061" are substantially leveled, within process variations.

Figure 8:
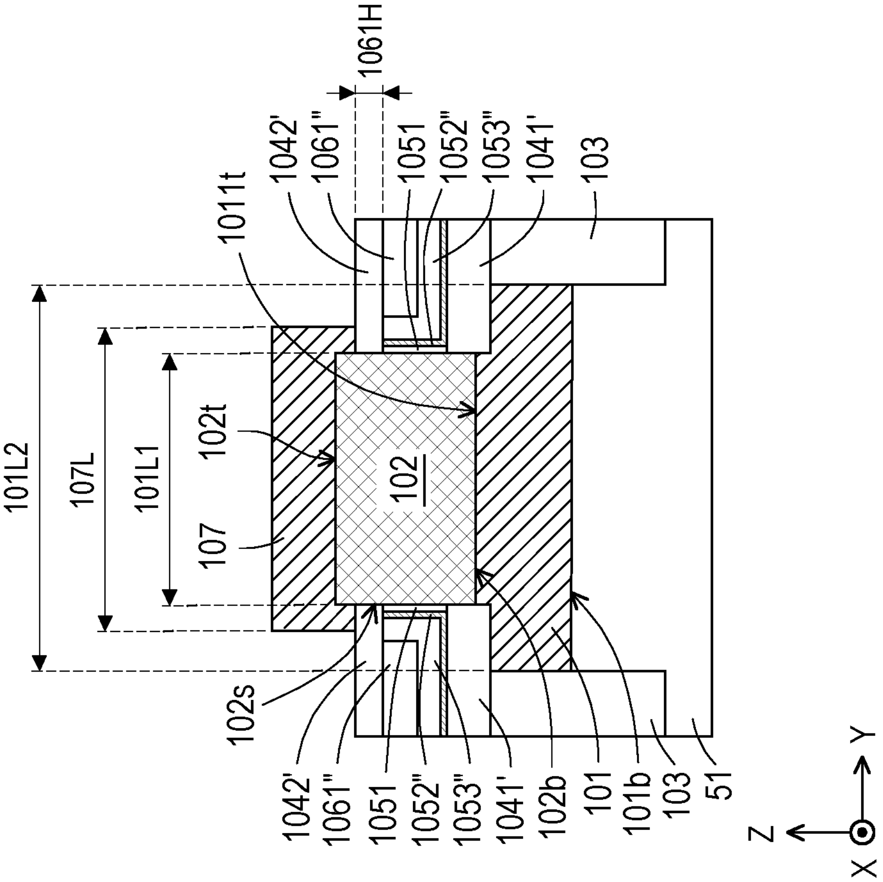

Referring to FIG. 8 and with reference to FIG. 7, a second spacer layer 1061' may be formed on the top surfaces of the interfacial layer 1051, the etched high-k dielectric layer 1052", the etched gate metal material layer 1053", and the etched first dielectric layer 1061" and may extend along the sidewalls 102*s* of the channel region 102. The second spacer layer 1061' may not fully cover the sidewalls 102*s* of the channel region 102. For example, an upper portion of the sidewalls 102*s* of the channel region 102 is accessibly revealed by the second spacer layer 1061'. The forming process of the second spacer layer 1061' may be similar to that of the first spacer layer 1041' described in FIG. 5, and thus the detailed descriptions are not repeated. Suitable materials for the second spacer layer 1061' may include oxide (e.g., $SiO_2$), nitride (e.g., SiN), SiON, SiCN, SiOCN, SiOC, combinations thereof, etc. The thickness 1061H of the second spacer layer 1061' may be in a range of about 2 nm to about 15 nm. Although other value of thickness may be possible, depending on design requirements. In some embodiments, after forming the second spacer layer 1061', the patterned hard mask layer 52 may be removed by etching or any suitable process, so that the upper portion of the sidewalls 102*s* and the top surface 102*t* of the channel region 102 are accessibly revealed, where the top surface 102*t* and the bottom surface 102*b* of the channel region 102 are opposite to each other.

Next, a second S/D epitaxial region 107 may be formed on the top surface 102*t* of the channel region 102 and may extend beyond the top surface 102*t* to cover the exposed portion of the sidewalls 102*s* of the channel region 102. The second S/D epitaxial region 107 extending along the sidewalls 102*s* of the channel region 102 may be in direct contact with the second spacer layer 1042'. In some embodiments, the lateral dimension 107L (e.g., the length) along the Y-direction of the second S/D epitaxial region 107 is greater than the lateral dimension 101L1 of the first top surface 1011*t* of the first S/D epitaxial region 101 and is less than the lateral dimension 101L2 of the bottom surface 101*b* of the first S/D epitaxial region 101. The forming process of the second S/D epitaxial region 107 may be similar to that of the first S/D epitaxial structure 101' described in FIG. 1, and thus the detailed descriptions are not repeated. The second S/D epitaxial region 107 formed in n-type FET region and p-type FET region may include different epitaxy materials, different dopants, and/or different doping concentrations depending on device design. Suitable materials for the second S/D epitaxial region 107 in n-type FET region may include SiP, SiAs, SiCP, III-V material (e.g., InP, GaAs, AlAs, InAs, InAlAs, InGaAs, and the like), combinations thereof, etc. Suitable epitaxy materials for the second S/D epitaxial region 107 in p-type FET region may include Si:B, SiGe:B, III-V material (e.g., InSb, GaSb, InGaSb, and the like), combinations thereof, etc.

Figure 9:
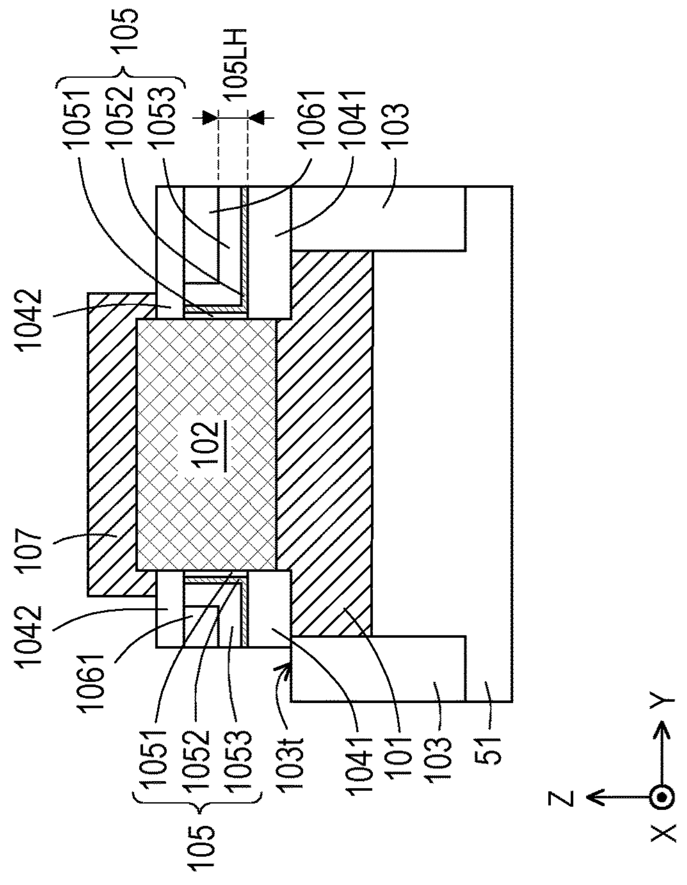

Referring to FIG. 9 and with reference to FIG. 8, a portion of the second spacer layer 1042' and portions of the etched first dielectric layer 1061", the etched gate metal material layer 1053", the etched high-k dielectric layer 1052", and the first spacer layer 1041' that underlay the portion of the second spacer layer 1042' may be removed to define a region of each gate structure 105. For example, the removal process is performed by using a combination of lithography and etching or any suitable patterning technique so as to respectively form a second spacer 1042, a first dielectric layer 1061, a gate metal layer 1053, a high-k dielectric layer 1052, and a first spacer 1041. The gate metal layer 1053, the high-k dielectric layer 1052, and the interfacial layer 1051 may be collectively referred to as the gate structure 105, and the interfacial layer 1051 and the high-k dielectric layer 1052 may be collectively referred to as a gate dielectric layer of the gate structure 105. In some embodiments, the vertical length 105LH of the gate structure 105 along the Z-direction is in a range of about 5 nm to about 20 nm. Although other value of the vertical length may be possible depending on product design and requirements. In some embodiments, after the removal process, at least a portion of the top surface 103*t* of one or more isolation structure 103 may be accessibly revealed.

Figure 10:
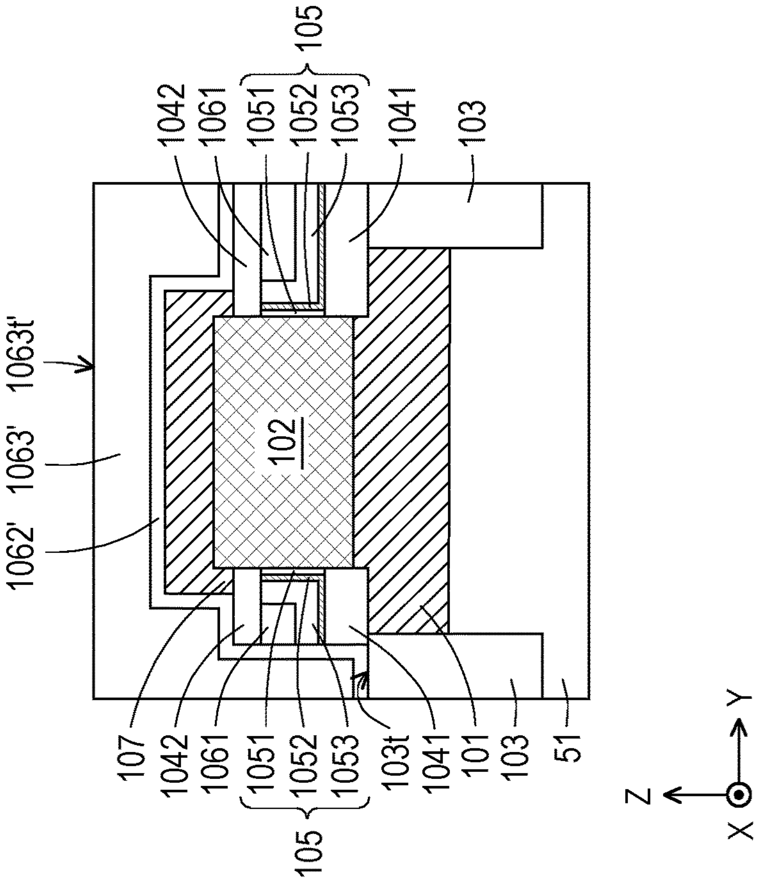

Referring to FIG. 10, a second contact etch stop material layer 1062' and a second interlayer dielectric (ILD) material layer 1063' may be sequentially formed. For example, after defining the gate structure 105, the second contact etch stop material layer 1062' is conformally formed to overlay the exposed top surface 103*t* of the isolation structure 103, the sidewall of the first spacer 1041, the sidewall of the gate structure 105, the sidewall of the first dielectric layer 1061, the sidewall and the exposed top surface of the second spacer 1042, and the sidewalls and the top surface of the second S/D epitaxial region 107. The second contact etch stop material layer 1062' may include a material that can be selectively etched from a material of the subsequently formed second ILD material layer 1063'. For example, the second contact etch stop material layer 1062' includes SiN, SiC, SiCN, and/or the like, and may be deposited using a conformal process, such as CVD, PECVD, PVD, and the like.

Next, the second ILD material layer 1063' may be formed on the second contact etch stop material layer 1062'. In some embodiments, the second ILD material layer 1063' includes low-k dielectric material(s) and may be formed by flowable chemical vapor deposition (FCVD) or other suitable deposition process. In some embodiments, a planarization process (e.g., chemical mechanical polishing (CMP), grinding, etching, combinations thereof, etc.) is performed on the second ILD material layer 1063' to provide a level top surface **1063*t*' of the second ILD material layer 1063'** for subsequent processing.

Referring to FIG. 11 and with reference to FIG. 10, an opening OP1 may be formed in the second ILD material layer 1063' and the second contact etch stop material layer 1062' to accessibly expose at least a portion of the top surface **107*t* of the second S/D epitaxial region 107. The opening OP1 may fully (or partially) expose the entirety of the top surface 107*t* of the second S/D epitaxial region 107. The opening OP1 may be formed by using any suitable process, such as a combination of lithography and etching. In some embodiments, various mask layers are employed to etch the second ILD material layer 1063' and the second contact etch stop material layer 1062' so as to form the second ILD material layer 1063" and the second contact etch stop material layer 1062", respectively. In some embodiments, the opening OP1 has slanted sidewalls with a wider top width and narrower bottom width. Alternatively, the opening OP1** has substantially vertical sidewalls.

Next, a second silicide feature 1081 may be formed in the exposed top surface **107*t* of the second S/D epitaxial region 107. In some embodiments, the second silicide feature 1081 is formed by depositing a conductive film (e.g., including a metal, such as Ti, Ni, Co, Pt, combinations thereof, etc.) on the exposed top surface 107*t* of the second S/D epitaxial region 107, and performing an annealing process to cause the diffusion of the material of conductive film into the second S/D epitaxial region 107. The annealing process may form the second silicide feature 1081 extending into the second S/D epitaxial region 107 within the opening OP1. The second silicide feature 1081 may include a combination of the semiconductor material of the second S/D epitaxial region 107 and the material of the conductive film, such as TiSi, NiSi, CoSi, PtSi, etc. Although other formation process may be performed to form the second silicide feature 1081**. Alternatively, the silicide feature may be replaced with the germanide feature, depending on the semiconductor material of the epitaxial region.

Subsequently, a second S/D contact 1082 may be formed on the second silicide feature 1081 and fill the rest space of the opening OP1. For example, the opening OP1 is filled with a conductive material such as W, Co, TiN, Ti, Ru, Mo, alloys thereof, combinations thereof, and the like to form the second S/D contact 1082 electrically connected to the second silicide feature 1081. The formation of the second S/D contact 1082 may include depositing diffusion barrier layers and/or seed layers (not illustrated) on a bottom surface and sidewalls of the opening OP1. For example, the diffusion barrier layer includes TiN, $TiO_2$, TaN, $TaO_2$, and the like, and the diffusion barrier layer may be formed to reduce diffusion of the conductive material of the second S/D contact 1082 into the surrounding dielectric material of the second ILD material layer 1063" and the second contact etch stop material layer 1062". The seed layer may be formed prior to the formation of the second S/D contact 1082, and forming the second S/D contact 1082 may include an electroless plating process, an electro-chemical plating process, and the like using the seed layer. In some embodiments, a planarization process (e.g., CMP, grinding, etching, combinations thereof, etc.) may be performed to remove excess conductive material from the second ILD material layer 1063". For example, the top surface **1063*t* of the second ILD material layer 1063" and the top surface 1082*t* of the second S/D contact 1082** are substantially leveled, within process variations.

Referring to FIG. 12A and with reference to FIG. 11, an opening OP2 may be formed into various dielectric layers to accessibly expose at least a portion of the gate structure 105, and then a gate contact 1083 may be formed in the opening OP2. For example, the opening OP2 is formed by using any suitable process, such as a combination of lithography and etching. In some embodiments, various mask layers are employed to etch the second ILD material layer 1063", the second contact etch stop material layer 1062", the second spacer 1042, and the first dielectric layer 1061 so as to respectively form the second ILD layer 1063, the second contact etch stop layer (CESL) 1062, the second spacer 1042, and the first dielectric layer 1061. In some embodiments, the opening OP2 has slanted sidewalls with a wider top width and narrower bottom width. Alternatively, the opening OP2 has substantially vertical sidewalls. The opening OP2 may accessibly expose a portion of the gate metal layer 1053 that was covered by the first dielectric layer 1061.

Next, the opening OP2 may be filled with a conductive material such as W, Co, TiN, Ti, Ru, Mo, alloys thereof, combinations thereof, and the like to form the gate contact 1083 electrically connected to the gate metal layer 1053 of the gate structure 105. The formation of the gate contact 1083 may include depositing diffusion barrier layers and/or seed layers (not illustrated) on a bottom surface and sidewalls of the opening OP2. For example, the diffusion barrier layer includes TiN, $TiO_2$, TaN, $TaO_2$, and the like, and the diffusion barrier layer may be formed to reduce diffusion of the conductive material of the gate contact 1083 into the surrounding dielectric materials. The seed layer may be formed prior to the formation of the gate contact 1083, and forming the gate contact 1083 may include an electroless plating process, an electro-chemical plating process, and the like using the seed layer. In some embodiments, a planarization process (e.g., CMP, grinding, etching, combinations thereof, etc.) may be performed to remove excess conductive material from the second ILD layer 1063 and the second S/D contact 1082. For example, the top surface **1063*t* of the second ILD layer 1063, the top surface 1082*t* of the second S/D contact 1082, and the top surface 1083*t* of the gate contact 1083** are substantially leveled, within process variations.

Referring to FIG. 12B and with reference to FIG. 12A, the structure illustrated in FIG. 12B shows the top view of the relative positions including the first S/D epitaxial region 101, the second S/D contact 1082, the second silicide feature 1081, the second S/D epitaxial region 107, the channel region 102, and the gate contact 1083. It should be noted that other features in FIG. 12A is not depicted in the top view of FIG. 12B for clarity purposes. It is also noted that the cross-sectional view of the FIG. 12A is taken along the Y-Y line outlined in FIG. 12B. The top-view shapes of the first S/D epitaxial region 101, the second S/D contact 1082, the second silicide feature 1081, the second S/D epitaxial region 107, the channel region 102, and the gate contact 1083 are illustrated in rectangular shapes; however, other shapes (e.g., circular shapes, oval shapes, polygonal shapes, etc.)

may be possible, depending on design requirements. In some embodiments, in the top view, the length 102L of the channel region 102 measured along the Y-direction is in a range of about 10 nm to about 100 nm. In the top view, the width 102W of the channel region 102 measured along the X-direction is in a range of about 2 nm to about 10 nm. Although other values of the length and width of the channel region 102 may be possible depending on product design and requirements.

In some embodiments, the orthographic projection area of the second S/D contact 1082 is less than the orthographic projection area of the first S/D epitaxial region 101, but greater than the orthographic projection area of the second S/D epitaxial region 107. In some embodiments, the orthographic projection area of the second S/D epitaxial region 107 is substantially coincided with (or equal to) that of the second silicide feature 1081. In some other embodiments, the orthographic projection area of the second silicide feature 1081 is less than that of the second S/D epitaxial region 107. In some embodiments, the orthographic projection area of the channel region 102 is less than that of the second S/D epitaxial region 107. In some embodiments, the second S/D contact 1082 and the gate contact 1083 are arranged in a substantially linear arrangement, along reference line Y-Y.

Figure 13:
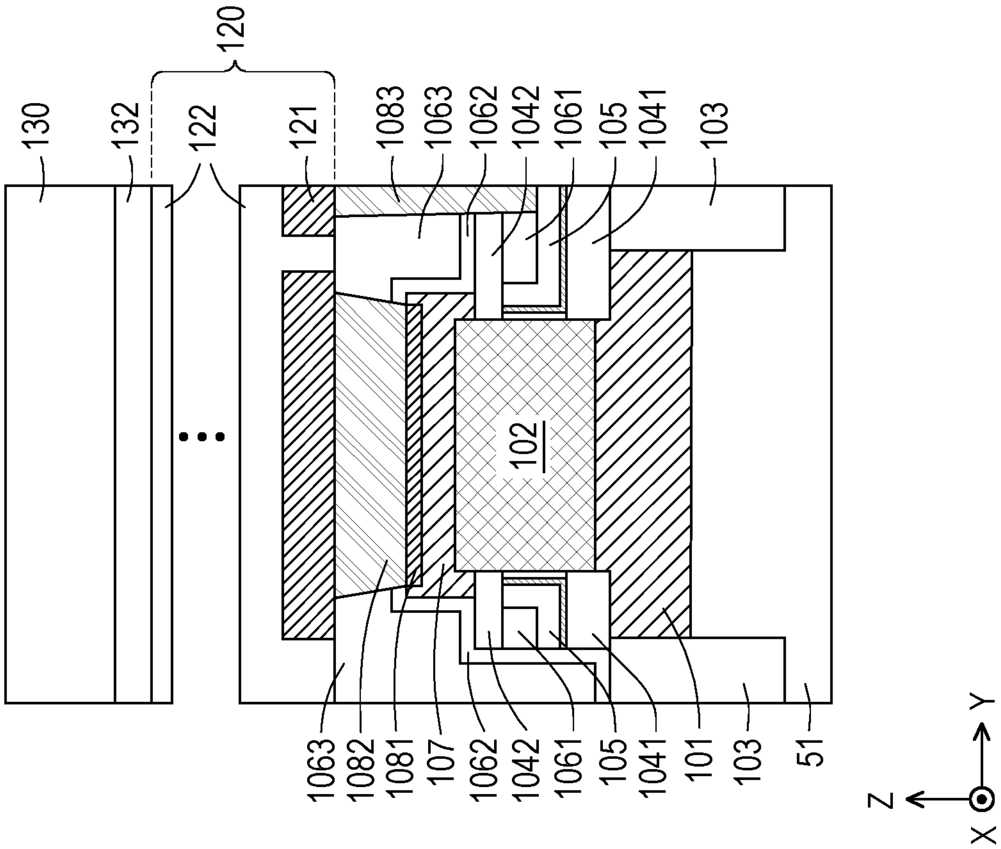

Referring to FIG. 13, a second interconnect structure 120 may be formed on the second ILD layer 1063, the second S/D contact 1082, and the gate contact 1083. The second interconnect structure 120 may be formed by metallization patterns 121 embedded in one or more dielectric layer(s) 122 on the second ILD layer 1063. The metallization patterns 121 include metal lines and vias (not shown) formed in the dielectric layer(s) 122. In some embodiments, the second interconnect structure 120 is formed of alternating layers of dielectric and conductive material with vias interconnecting the layers of conductive material and may be formed through any suitable process (such as deposition, damascene, dual damascene, or the like). The dielectric layers 122 may include suitable dielectric material such as TEOS oxide, silicon oxide, silicon nitride, silicon oxynitride, hafnium oxide, zirconium oxide, titanium oxide, aluminum oxide, PSG, BPSG, other suitable dielectric materials, and/or combinations thereof. The metallization patterns 121 may be formed on and electrically connected to the second S/D contact 1082 and the gate contact 1083. For example, back-end-of-line (BEOL) processes are performed to form the second interconnect structure 120, and the second interconnect structure 120 may be referred to as the BEOL routing.

Next, a carrier substrate 130 may be bonded to the second interconnect structure 120 through a bonding layer 132. The carrier substrate 130 may be any appropriate support structure, and may include a semiconductor substrate, such as a bulk semiconductor, a SOI substrate, or the like. Other substrates, such as a glass substrate, a multi-layered substrate or a gradient substrate may also be used. For example, the semiconductor material of the semiconductor substrate may include Si, Ge, a compound semiconductor, an alloy semiconductor, or combinations thereof, etc. The carrier substrate 130 may (or may not) include active devices and/or passive devices. The bonding layer 132 may be provided on the carrier substrate 130 for bonding to the second interconnect structure 120. In some embodiments, the bonding layer 132 is formed of a dielectric material such as USG, PSG, BPSG, FSG, $SiO_2$, SiN, SiC, SiON, compounds thereof, composites thereof, combinations thereof, or any suitable bonding material. For example, the bonding layer 132 is fused to the outermost dielectric layer 122 of the second interconnect structure 120 through dielectric-to-dielectric bonds. Alternatively, the bonding layer 132 further includes metal features (not shown), and the bonding interface of the bonding layer 132 and the second interconnect structure 120 may include metal-to-metal bonds, dielectric-to-dielectric bonds, and/or metal-to-dielectric bonds. In some embodiments, the bonding process is performed on the wafer level. That is, wafer-to-wafer bonding may be employed.

Figure 14:
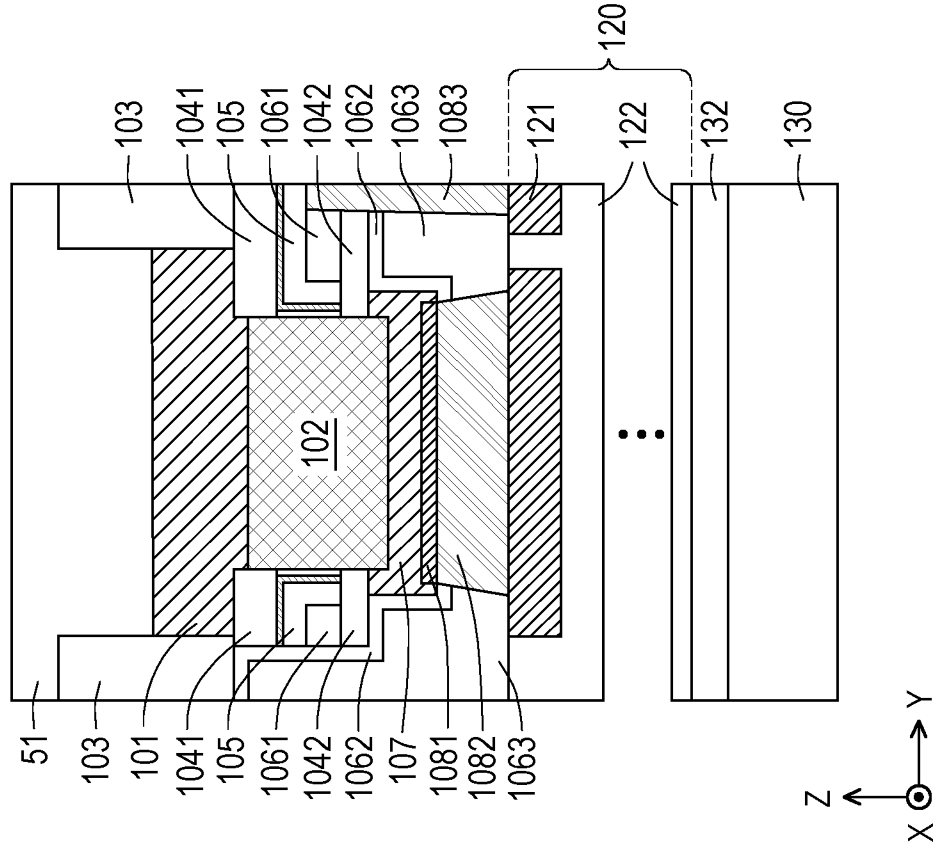

Referring to FIGS. 14-15 and with reference to FIG. 13, the orientation of the structure shown in FIG. 13 may be flipped upside-down so that the patterned substrate 51 may face upwardly for further processing. Next, the patterned substrate 51 and portions of the isolation structure 103 laterally adjoining the patterned substrate 51 may be removed through any suitable process (e.g., grinding, etching, combinations thereof, etc.) until the bottom surface 101*b* of the first S/D epitaxial region 101 is accessibly revealed. In some embodiments, the bottom surface 101*b* of the first S/D epitaxial region 101 and the bottom surfaces 103*b* of the isolation structures 103 are substantially leveled after the removal of the patterned substrate 51. Subsequently, a first contact etch stop material layer 1064' may be formed on the bottom surface 101*b* of the first S/D epitaxial region 101 and the bottom surfaces 103*b* of the isolation structures 103, and then a first ILD material layer 1065' may be formed on the first contact etch stop material layer 1064'. The forming processes and the materials of the first contact etch stop material layer 1064' and the first ILD material layer 1065' may be similar to those of the second contact etch stop material layer 1062' and the second ILD material layer 1063' described in FIG. 10, and thus the detailed descriptions are omitted for the sake of brevity.

Referring to FIGS. 16A-16B and with reference to FIG. 15, the cross-sectional view of the FIG. 16B is taken along the X-X line outlined in FIG. 16A. In some embodiments, an opening OP3 may be formed in the first contact etch stop material layer 1064' and the first ILD material layer 1065', and the opening OP3 may accessibly expose at least a portion of the bottom surface 101*b* of the first S/D epitaxial region 101. The opening OP3 may fully (or partially) expose the entirety of the bottom surface 101*b* of the first S/D epitaxial region 101. The forming process of the opening OP3 may be similar to that of the opening OP1 described in FIG. 11. In some embodiments, various mask layers are employed to etch the first contact etch stop material layer 1064' and the first ILD material layer 1065' so as to form a first CESL 1064 and a first ILD layer 1065, respectively. In some embodiments, the opening OP3 has slanted sidewalls with a wider top width and narrower bottom width. Alternatively, the opening OP3 has substantially vertical sidewalls. Next, a first silicide feature 1091 may be formed in the exposed bottom surface 101*b* of the first S/D epitaxial region 101. The forming process and the material of the first silicide feature 1091 may be similar to those of the second silicide feature 1081 described in FIG. 11, and thus the detailed descriptions are omitted for the sake of brevity. Alternatively, the silicide feature may be replaced with the germanide feature, depending on the semiconductor material of the epitaxial region.

Subsequently, a first S/D contact 1092 may be formed on the first silicide feature 1091 and fill the rest space of the opening OP3, such that the first S/D contact 1092 may be electrically connected to the first silicide feature 1091. The forming process and the material of the first S/D contact 1092 may be similar to those of the second S/D contact 1082 described in FIG. 11, and thus the detailed descriptions are omitted for the sake of brevity. In some embodiments, a planarization process (e.g., CMP, grinding, etching, combinations thereof, etc.) is performed to remove excess conductive material from the first ILD layer 1065. For example, the surface 1065*t* of the first ILD layer 1065 and the surface 1092*t* of the first S/D contact 1092 are substantially leveled, within process variations. In some embodiments, a vertical dimension (e.g., the height) 1083H of the gate contact 1083 is greater than a vertical dimension 1092H of the first S/D contact 1092 and may also be greater than a vertical dimension 1082H of the second S/D contact 1082. In some embodiments, a maximum lateral dimension (e.g., the length) 1092L of the first S/D contact 1092 is greater than a maximum lateral dimension 1082L of the second S/D contact 1082.

Referring to FIG. 16C and with reference to FIG. 16A and FIG. 12B, the structure illustrated in FIG. 16C is similar to the top view of FIG. 12B, except that FIG. 16A further shows the relative position including the first S/D contact 1092 and the first silicide feature 1091. It should be noted that other features in FIG. 16A is not depicted in the top view of FIG. 16C for clarity purposes, and the cross-sectional view of the FIG. 16A is taken along the Y-Y line outlined in FIG. 16C. In addition, it should be understood that the top-view shapes of the first S/D contact 1092 and the first silicide feature 1091 are illustrated in rectangular shapes; however, other shapes (e.g., circular shapes, oval shapes, polygonal shapes, etc.) may be possible, depending on design requirements.

In some embodiments, the first S/D contact 1092 has a greater dimension than the dimension of the second S/D contact 1082 in the top view. For example, the orthographic projection area of the second S/D contact 1082 overlaps and is fully located within the orthographic projection area of the first S/D contact 1092. In some embodiments, the orthographic projection area of the first S/D epitaxial region 101 overlaps and is fully located within the orthographic projection area of the first S/D contact 1092. The orthographic projection area of the first silicide feature 1091 may be substantially coincided with the orthographic projection area of the first S/D epitaxial region 101. Alternatively, the dimension of the first silicide feature 1091 in the top view is less than that of the first S/D epitaxial region 101, and thus the orthographic projection area of the first silicide feature 1091 is encircled by that of the first S/D epitaxial region 101. It should be noted that the configuration shown in FIG. 16C is merely an example, other configurations of the first S/D contact 1092 and the first silicide feature 1091 may be possible.

Figure 17:
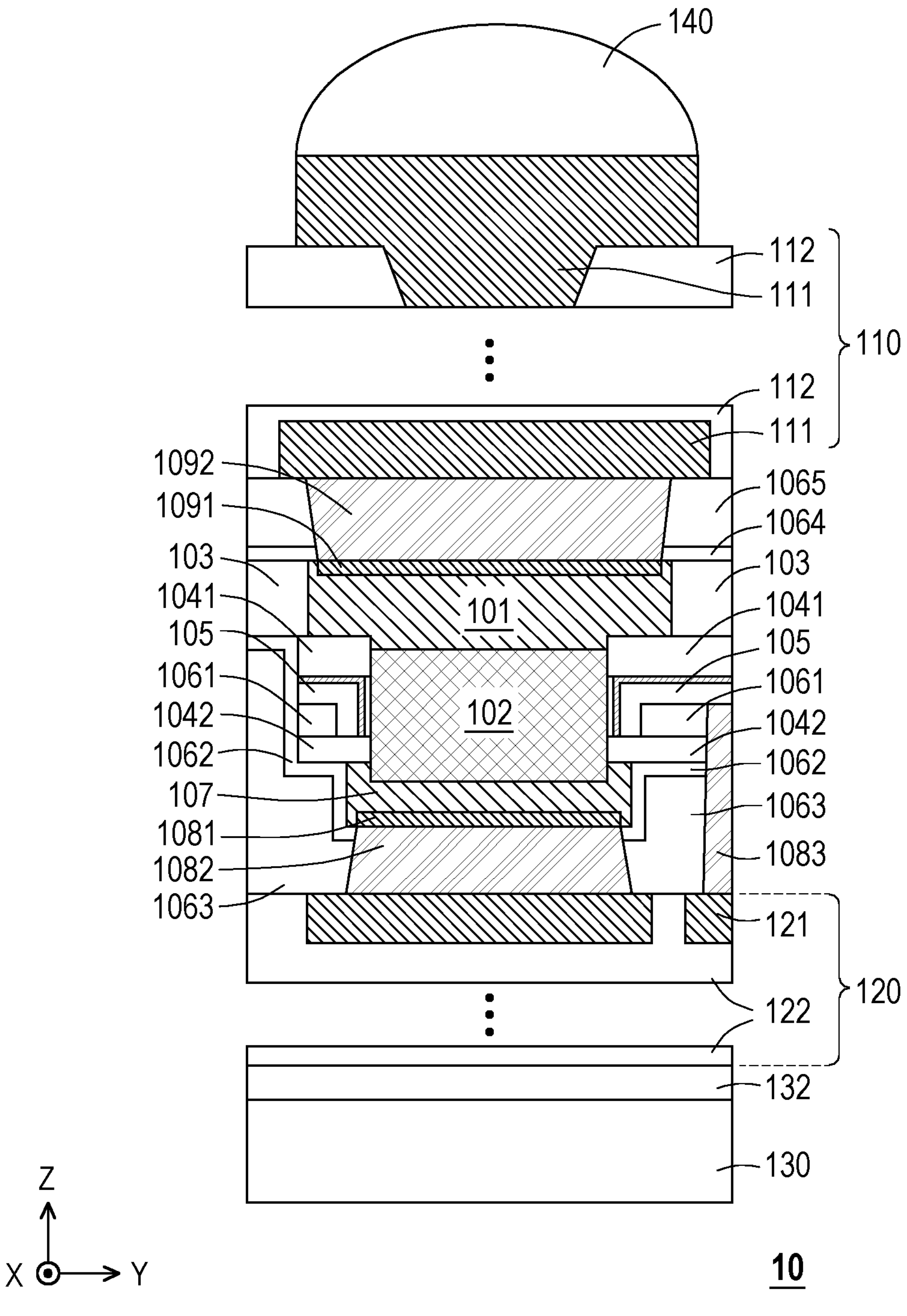

Referring to FIG. 17, a first interconnect structure 110 may be formed on the first ILD layer 1065 and the first S/D contact 1092. The first interconnect structure 110 may be formed by metallization patterns 111 embedded in one or more dielectric layer(s) 112 on the first ILD layer 1065. The metallization patterns 111 include metal lines and vias formed in the dielectric layer(s) 112. In some embodiments, the first interconnect structure 110, similar to the second interconnect structure 120, is formed of alternating layers of dielectric and conductive material with vias interconnecting the layers of conductive material and may be formed through any suitable process. For example, BEOL processes are performed to form the first interconnect structure 110, and the first interconnect structure 110 may also be referred to as the BEOL routing. The material of the dielectric layers 112 may be similar to that of the dielectric layers 122, and thus the detailed descriptions are not repeated. The metallization patterns 111 of the first interconnect structure 110 may be formed on and electrically connected to the first S/D contact 1092.

Next, conductive bump(s) 140 may be formed on the first interconnect structure 110 and electrically coupled to the first S/D contact 1092 through the metallization patterns 111 of the first interconnect structure 110. The conductive bump 140 may be or may include micro-bumps, controlled collapse chip connection (C4) bumps, metal pillars, solder balls, ball grid array (BGA) connectors, electroless nickel-electroless palladium-immersion gold (ENEPIG) formed bumps, or the like. The conductive bump 140 may include a conductive material such as solder, copper, aluminum, gold, nickel, silver, palladium, tin, the like, or a combination thereof. In some embodiments, the conductive bump 140 includes a pillar portion connected to the bump pad of the metallization patterns 111 and a cap portion formed on the pillar portion. Alternatively, the conductive bump 140 may include a bump shape or may have a substantially vertical sidewall. It is noted that the shape of the conductive bump 140 shown herein is provided for illustrative purposes, the conductive bump 140 may have various cross sections depending on the design requirements.

In some embodiments, the aforementioned processes are performed at wafer level, and a singulation process may be performed to form a plurality of semiconductor devices 10. For example, a dicing tool may cut along scribe lines (not shown) to cut off the dielectric layers 112 of the first interconnect structure 110, the first ILD layer 1065, the first CESL 1064, the isolation structure 103, the second CESL 1062, the second ILD layer 1063, the dielectric layers 122 of the second interconnect structure 120, the bonding layer 132, and the carrier substrate 130 to form coterminous sidewalls of the semiconductor device 10. The semiconductor device 10 may include multiple vertical gate-all-around (VGAA) transistors, although a single VGAA transistor is illustrated herein. For example, each VGAA transistor includes a nanowire which may share the gate structure 105 encircling vertical channel region 102 in each nanowire. Although only one nanowire is illustrated, any number of nanowires may be formed for each VGAA transistor. The nanowire may include the second S/D epitaxial region 107, the channel region 102 over the second S/D epitaxial region 107, and the first S/D epitaxial region 101 over the channel region 102. Given its placement in the semiconductor device 10 shown in FIG. 17, the first S/D epitaxial region 101 may be referred to as the top S/D epitaxial region and the second S/D epitaxial region 107 may be referred to as the bottom S/D epitaxial region. The gate structure 105 may be formed around the channel region 102 of the nanowire, and the channel region 102 may be substantially undoped or lightly doped with n-type or p-type dopants depending on whether VGAA transistor is n-type or p-type transistor.

The first S/D contact 1092 of the semiconductor device 10 is electrically coupled to the first S/D epitaxial region 101 through the first silicide feature 1091, and the second S/D contact 1082 is electrically coupled to the second S/D epitaxial region 107 through the second silicide feature 1081. That is, the first S/D contact 1092 and the second S/D contact 1082 are disposed at opposing sides of the channel region 102. Such configuration may be beneficial to increase the contact area between the first S/D contact 1092 and the first S/D epitaxial region 101 compared to the configuration of the first S/D contact being disposed at the same side with the second S/D contact, and hence the first S/D contact may also benefit reduction of the contact resistance. Moreover, if the first S/D contact and the second S/D contact are disposed at the same side of the channel region and the first S/D contact needs to extend through various dielectric layers to be in contact with the first S/D epitaxial region, the vertical dimension (e.g., the height) of the first S/D contact should be greater than the gate contact, and thus the contact area is small and the parasitic resistance is high, thereby limiting improvements to the driving current of the device. On the contrary, configuring the first S/D contact 1092 and the second S/D contact 1082 at the opposing sides of the channel region 102, the vertical dimension (e.g., the height) of the first S/D contact 1092 is smaller compared to the gate contact 1083, and the contact area can be increased and the contact resistance is thus reduced.

In addition, the layout (e.g., FIG. 16C) of the semiconductor device 10 may achieve an area reduction compared to the layout having the first S/D contact, the second S/D contact, and the gate contact disposed at the same side of the channel region. In some embodiments, compared to the layout having the first S/D contact, the second S/D contact, and the gate contact disposed at the same side of the channel region, the layout (e.g., FIG. 16C) of the semiconductor device 10 enables to save the space for forming additional conductive features, and shorter cell height with the same channel length may be obtained. In some other embodiments, compared to the layout having the first S/D contact, the second S/D contact, and the gate contact disposed at the same side of the channel region, the layout (e.g., FIG. 16C) of the semiconductor device 10 has greater length of the channel region, thereby obtaining greater effective area of the channel region. Furthermore, positioning the second S/D contact 1082 underneath the first S/D contact 1092 may decrease the effective footprint, and hence the flexibility of layout may be improved.

The semiconductor device 10 may be or may include a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The semiconductor device 10 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

Figure 18A:
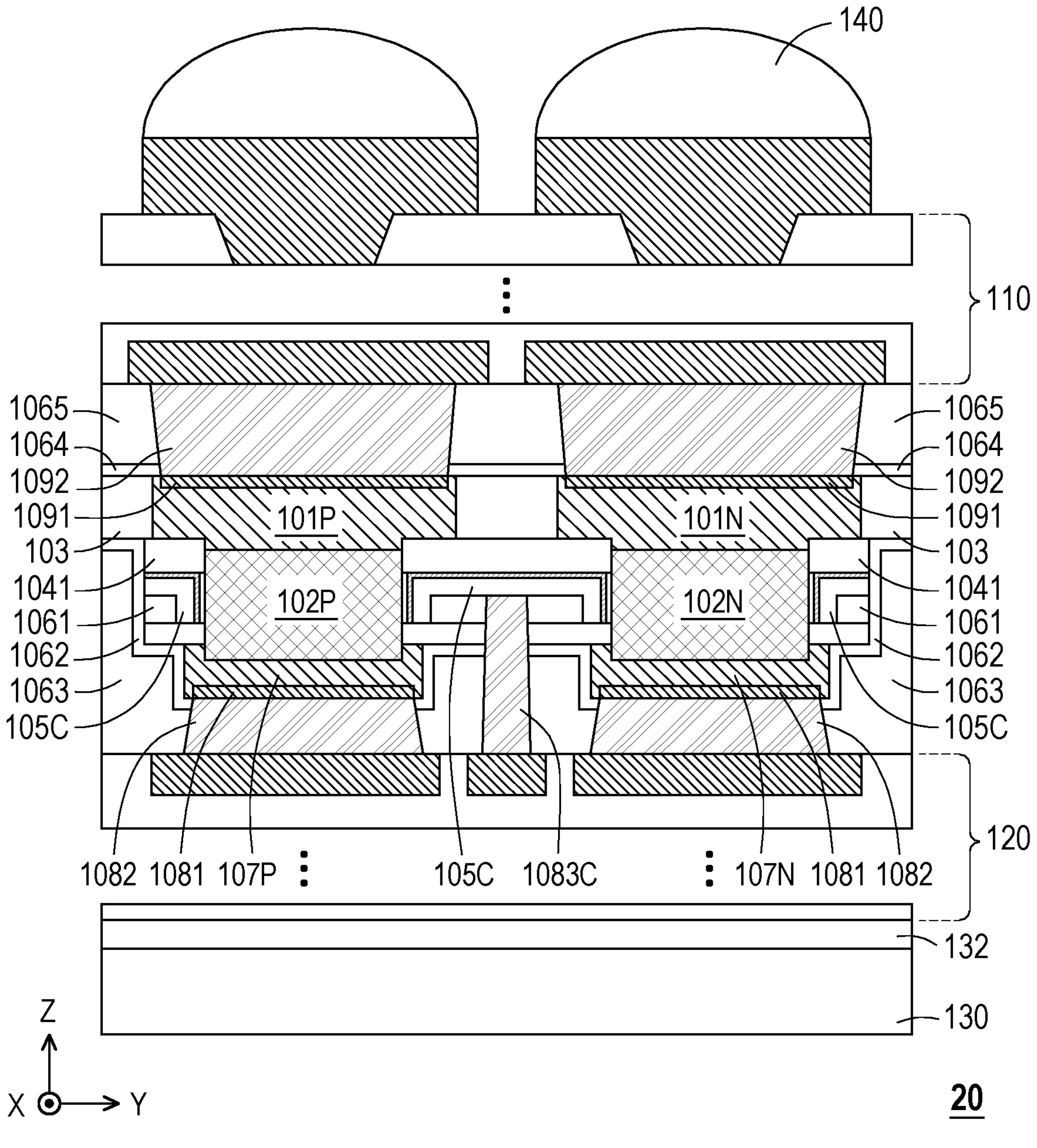
FIG. 18A is a schematic cross-sectional view of a semiconductor device, in accordance with some embodiments.
Figure 18B:
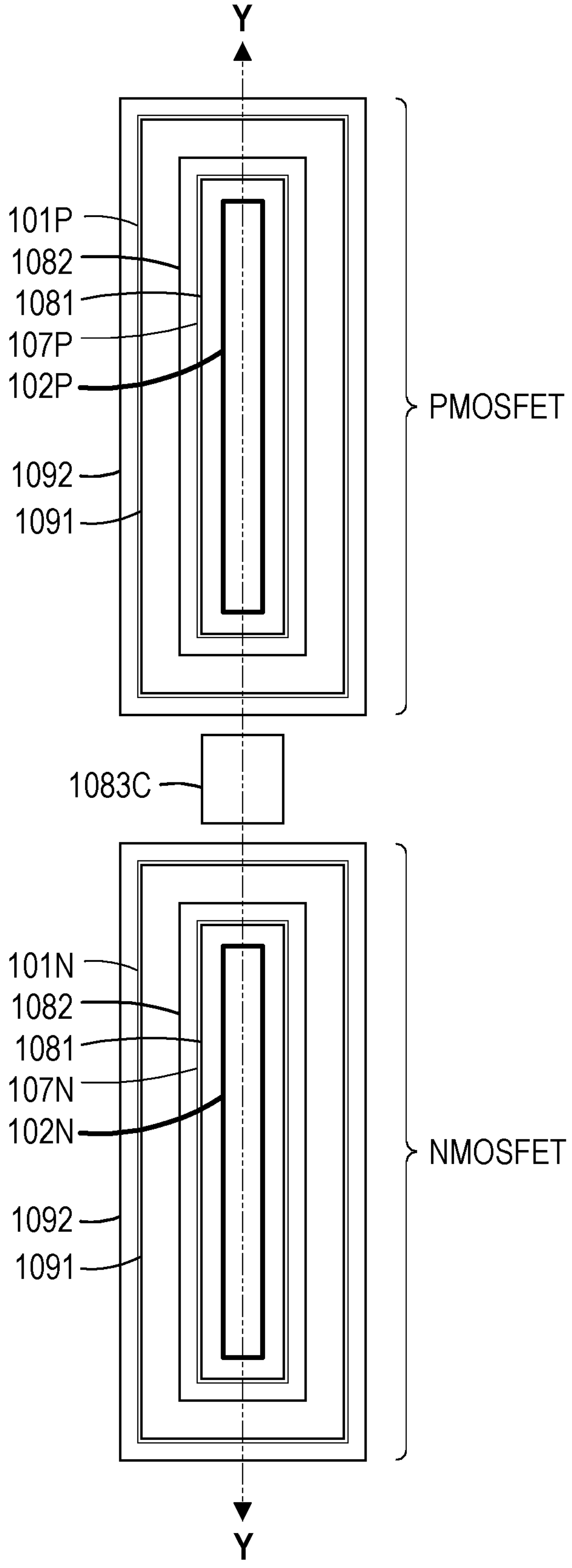
FIG. 18B is a schematic and simplified top view illustrating the semiconductor device in FIG. 18A, in accordance with some embodiments.

FIG. 18A is a schematic cross-sectional view of a semiconductor device, and FIG. 18B is a schematic and simplified top view illustrating the semiconductor device in FIG. 18A, in accordance with some embodiments. Unless specified otherwise, the materials and the formation methods of the components in these embodiments are essentially the same as the like components, which are denoted by like reference numerals in the embodiments.

Referring to FIG. 18A and with reference to FIG. 17, a semiconductor device 20 having a complementary metal-oxide-semiconductor (CMOS) inverter is provided. The semiconductor device 20 shown in FIG. 18A is similar to the semiconductor device 10 illustrated in FIG. 17, except that the semiconductor device 20 includes a common gate structure 105C on the NMOS (n-channel MOSFET) and the PMOS (p-channel MOSFET) devices be connected together, where the NMOSFET includes the first and S/D epitaxial regions 101N and 107N and the channel region 102N, the PMOSFET includes the first and S/D epitaxial regions 101P and 107P and the channel region 102P, and the common gate contact 1083C connected to the common gate structure 105C is between the NMOSFET and the PMOSFET. For example, during the step of defining the gate structure (e.g., FIG. 9), the patterning process is performed on a predetermined region so as to form the common gate structure 105C interposed between NMOSFET and the PMOSFET.

Referring to FIG. 18B and with reference to FIG. 18A and the FIG. 16A, the structure illustrated in FIG. 18B is similar to the top view of FIG. 16A, except that FIG. 18B shows the relative positions including the NMOSFET, the PMOSFET, and the common gate contact 1083C. The configurations of the NMOSFET and the PMOSFET may be the same (or similar). The configuration of each NMOSFET and the PMOSFET may be similar to the configuration shown in FIG. 16A, and thus the detailed descriptions are not repeated for the sake of brevity. It should be noted that other features in FIG. 18A is not depicted in the top view of FIG. 18B for clarity purposes, and the cross-sectional view of the FIG. 18A is taken along the Y-Y line outlined in FIG. 18B.

According to some embodiments, a semiconductor device includes a channel region, a first S/D contact, a second S/D contact, a first S/D epitaxial region, a second S/D epitaxial region, a gate structure, and a gate contact. The channel region includes a first surface, a second surface opposite to the first surface, and a sidewall connected to the first surface and the second surface. The first S/D contact is disposed over the first surface of the channel region, the second S/D contact is disposed underneath the second surface of the channel region, the first S/D epitaxial region underlies the first S/D contact and overlies the first surface of the channel region, and the second S/D epitaxial region overlies the second S/D contact and underlies the second surface of the channel region. The gate structure surrounds the sidewall of the channel region, and the gate contact is disposed in proximity to the second S/D contact and lands on the gate structure.

According to some alternative embodiments, a semiconductor device includes a transistor which includes a channel region, a first S/D epitaxial region, a first S/D contact, a second S/D epitaxial region, a second S/D contact, a gate structure, and a gate contact. The first channel region includes a first surface and a second surface opposite to each other. The first S/D epitaxial region and the first S/D contact are disposed on the first surface of the first channel region, and the first S/D epitaxial region is interposed between the first channel region and the first S/D contact. The second S/D epitaxial region and the second S/D contact are disposed on the second surface of the first channel region, and the second S/D epitaxial region is interposed between the first channel region and the second S/D contact, where a boundary of the second S/D contact is encircled by a boundary of the first S/D contact in a top view. The gate structure is disposed around the channel region, and the gate contact is disposed in proximity to the second S/D contact and coupled to the gate structure.

According to some alternative embodiments, a manufacturing method of a semiconductor device includes forming a channel region on a first source/drain (S/D) region over a substrate; forming a gate material stack over the first S/D epitaxial region, wherein the gate material stack surrounds the channel region; forming a second S/D epitaxial region on the channel region; forming a S/D contact on the second S/D epitaxial region; removing the substrate to accessibly expose a surface of the first S/D epitaxial region; and forming another S/D contact on the surface of the first S/D epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a channel region comprising a first surface, a second surface opposite to the first surface, and a sidewall connected to the first surface and the second surface;

a first source/drain (S/D) contact disposed over the first surface of the channel region;

a second S/D contact disposed underneath the second surface of the channel region, wherein the first S/D contact and the second S/D contact have different maximum lateral dimensions;

a first S/D epitaxial region underlying the first S/D contact and overlying the first surface of the channel region;

a second S/D epitaxial region overlying the second S/D contact and underlying the second surface of the channel region, wherein a contact area between the second S/D epitaxial region and the channel region is greater than a contact area between the first S/D epitaxial region and the channel region;

a gate structure surrounding the sidewall of the channel region;

a gate contact disposed in proximity to the second S/D contact and landing on the gate structure;

a first spacer overlying the gate structure and underlying the first S/D epitaxial region;

a second spacer overlying the second S/D epitaxial region and underlying the gate structure, wherein the first surface of the channel region is lower than a top surface of the first spacer layer, and the channel region is lower than a bottom surface of the second spacer layer;

a first interconnect structure overlying and electrically connected to the first S/D contact at a first side; and a second interconnect structure underlying and electrically connected to the second S/D contact and the gate contact at a second side opposite to the first side.

2. The semiconductor device of claim 1, further comprising:

a first silicide feature interposed between the first S/D epitaxial region and the first S/D contact;

a second silicide feature interposed between the second S/D epitaxial region and the second S/D contact;

a first contact etch stop layer (CESL) disposed over the first S/D epitaxial region and laterally surrounding the first S/D contact;

a first interlayer dielectric (ILD) layer disposed over the first CESL and laterally surrounding the first S/D contact;

a second CESL covering sidewalls of the second S/D epitaxial region and extending to the gate contact; and a second ILD layer disposed underneath the second CESL and laterally surrounding the second S/D epitaxial region, the second silicide feature, and the second S/D contact.

3. The semiconductor device of claim 1, wherein a height of the gate contact is greater than a height of the first S/D contact.

4. The semiconductor device of claim 1, wherein a maximum lateral dimension of the first S/D contact is greater than a maximum lateral dimension of the second S/D contact.

5. The semiconductor device of claim 1, wherein in a top view, an orthographic projection area of the second S/D contact overlaps and is disposed within an orthographic projection area of the first S/D contact.

6. The semiconductor device of claim 1, wherein in a top view, an orthographic projection area of the second S/D epitaxial region overlaps and is disposed within an orthographic projection area of the first S/D epitaxial region.

7. The semiconductor device of claim 1, wherein a lateral dimension of the second S/D epitaxial region is greater than a lateral dimension of the channel region.

8. The semiconductor device of claim 1, wherein:

the first spacer is configured to separate the first S/D epitaxial region from the gate structure, and the first spacer is adjacent to the sidewall of the channel region and the first S/D epitaxial region; and the second spacer is configured to separate the gate structure from the second S/D epitaxial region, and the second spacer is adjacent to the sidewall of the channel region.

9. A semiconductor device, comprising:

a spacer layer having a top surface and a bottom surface opposite to each other;

an opening extending from the top surface to the bottom surface of the spacer layer;

a channel region disposed in the opening and having a first surface and a second surface opposite to each other, wherein the first surface of the channel region is a horizontal surface connecting opposite sidewalls of the spacer layer, the first surface of the channel region is lower than the top surface of the spacer layer, and the channel region is lower than the bottom surface of the spacer layer;

a first S/D epitaxial region interfacing with the first surface of the channel region and further extending to cover a portion of the top surface of the spacer layer; and a second S/D epitaxial region interfacing with the channel region and further extending to cover a portion of a sidewall of the channel region.

10. The semiconductor device of claim 9, further comprising:

a dielectric layer embedded in the spacer layer to divide the spacer layer into a first spacer and a second spacer; and a gate structure laterally surrounding the channel region, wherein the gate structure comprises a horizontal portion extending between a bottom surface of the first spacer and a top surface of the dielectric layer, and a vertical portion extending between the sidewall of the channel region and a sidewall of the dielectric layer.

11. The semiconductor device of claim 9, further comprising:

a first S/D contact disposed over the first surface of the channel region, and the first S/D epitaxial region interposed between the first surface of the channel region and the first S/D contact; and a second S/D contact disposed underneath the channel region, and the second S/D epitaxial region interposed between the channel region and the second S/D contact.

12. The semiconductor device of claim 11, further comprising:

a first silicide feature interposed between the first S/D epitaxial region and the first S/D contact; and a second silicide feature interposed between the second S/D epitaxial region and the second S/D contact.

13. The semiconductor device of claim 11, wherein the first S/D contact and the second S/D contact have different maximum lateral dimensions.

14. The semiconductor device of claim 11, further comprising:

a first interconnect structure overlying and electrically connected to the first S/D contact at a first side; and a second interconnect structure underlying and electrically connected to the second S/D contact at a second side opposite to the first side.

15. The semiconductor device of claim 9, wherein a contact area between the second S/D epitaxial region and the channel region is greater than a contact area between the first S/D epitaxial region and the channel region.

16. A manufacturing method of a semiconductor device, comprising:

forming a spacer layer having a top surface and a bottom surface opposite to each other;

forming an opening extending from the top surface to the bottom surface of the spacer layer;

forming a channel region in the opening, wherein the channel region has a first surface and a second surface opposite to each other, wherein the first surface of the channel region is a horizontal surface connecting opposite sidewalls of the spacer layer, the first surface of the channel region is lower than the top surface of the spacer layer, and the second surface of the channel region is lower than the bottom surface of the spacer layer;

forming a first S/D epitaxial region to interface with the first surface of the channel region, wherein the first S/D epitaxial region further extends to cover a portion of the top surface of the spacer layer; and forming a second S/D epitaxial region to interface with the channel region, wherein the second S/D epitaxial region further extends to cover a portion of a sidewall of the channel region.

17. The manufacturing method of claim 16, further comprising:

forming a first S/D contact over the first surface of the channel region, wherein the first S/D epitaxial region is interposed between the first surface of the channel region and the first S/D contact; and forming a second S/D contact disposed underneath the channel region, wherein the second S/D epitaxial region is interposed between the channel region and the second S/D contact.

18. The manufacturing method of claim 17, further comprising:

forming a first silicide feature between the first S/D epitaxial region and the first S/D contact; and forming a second silicide feature between the second S/D epitaxial region and the second S/D contact.

19. The manufacturing method of claim 17, wherein the first S/D contact and the second S/D contact have different maximum lateral dimensions.

20. The manufacturing method of claim 17, further comprising:

forming a first interconnect structure over and electrically connected to the first S/D contact at a first side; and forming a second interconnect structure over and electrically connected to the second S/D contact at a second side opposite to the first side.

* * * * *